(12) United States Patent
Sorensen (10) Patent No.: US 8,198,885 B2
(45) Date of Patent: Jun. 12, 2012

(54) SHIELDED CURRENT SENSOR

(76) Inventor: Thomas Sorensen, Annacotty (IE)

( * ) Notice: Subject to any disclaimer, the term of this patent is extended or adjusted under 35 U.S.C. 154(b) by 506 days.

(21) Appl. No.: 11/920,665

(22) PCT Filed: May 18, 2006

(86) PCT No.: PCT/IE2006/000060
§ 371 (c)(1),
(2), (4) Date: Jul. 2, 2008

(87) PCT Pub. No.: WO2006/123320
PCT Pub. Date: Nov. 23, 2006

(65) Prior Publication Data
US 2009/0115399 A1  May 7, 2009

(30) Foreign Application Priority Data

May 18, 2005 (IE) .................................. S2005/0329

(51) Int. Cl.
*G01R 1/20* (2006.01)
*G01R 15/18* (2006.01)
*G01R 33/07* (2006.01)
(52) U.S. Cl. ...................... 324/126; 324/127; 324/117 H
(58) Field of Classification Search .............. 324/117 R, 324/117 H, 126, 158.1, 765, 762.01–762.1, 324/726; 336/173, 174, 208, 225; 257/48; 438/14–18
See application file for complete search history.

(56) References Cited

U.S. PATENT DOCUMENTS

| 4,810,989 | A | 3/1989 | Brandenberg et al. |
| 5,181,026 | A | 1/1993 | Granville |
| 6,351,114 | B1 | 2/2002 | Iwasaki et al. |
| 6,636,029 | B1 | 10/2003 | Kunze et al. |
| 6,965,225 | B2 * | 11/2005 | de Buda .................... 324/117 R |
| 7,227,348 | B2 | 6/2007 | Sorensen |
| 2004/0257061 | A1 | 12/2004 | George de Buda |

FOREIGN PATENT DOCUMENTS

| IE | 20010370 | 10/2001 |
| WO | 2004086063 A1 | 10/2004 |

* cited by examiner

*Primary Examiner* — Huy Q Phan
*Assistant Examiner* — Tung X Nguyen
(74) *Attorney, Agent, or Firm* — Whiteford Taylor Preston (57) ABSTRACT

A planar magnetic current sensor is described, incorporating a number of features designed to improve the efficiency and reliability of the basic sensor. The improvements comprise providing inner and outer conductive shields, an increased number of sensor elements for a given circuit board area, and distributing the resistance of the sensor circuitry. The conductive shields prevent high transient voltages and eddy currents that may damage the sensor itself. The depth of the inner and outer conductive shields is chosen to produce eddy currents sufficient to attenuate the magnetic fields associated with transient pulses of a frequency above the frequencies to be measured. An aperture is provided from the exterior of the conductive shields or sealing caps, if present, to an annular space, to allow an output signal to pass from the interior of the sensor to the exterior of the sensor for monitoring.

30 Claims, 6 Drawing Sheets

SHIELDED CURRENT SENSOR

TECHNICAL FIELD

This invention relates to current sensors.

BACKGROUND OF THE INVENTION

In general, di/dt based current measurement devices are used for measuring very low alternating current in a conductor, conductors which may also intermittently be subject to extremely high peak transient currents. Existing di/dt based current measurement sensors have inherent limitations, which inhibit their use in this type of application.

In a di/dt sensor, a voltage proportional to the amplitude as well as the frequency of the current being measured is generated in the sensor.

One example of a di/dt sensor is the planar magnetic printed circuit board current sensor described in Irish Patent Application No. S2001/0370.

Figure 1A:
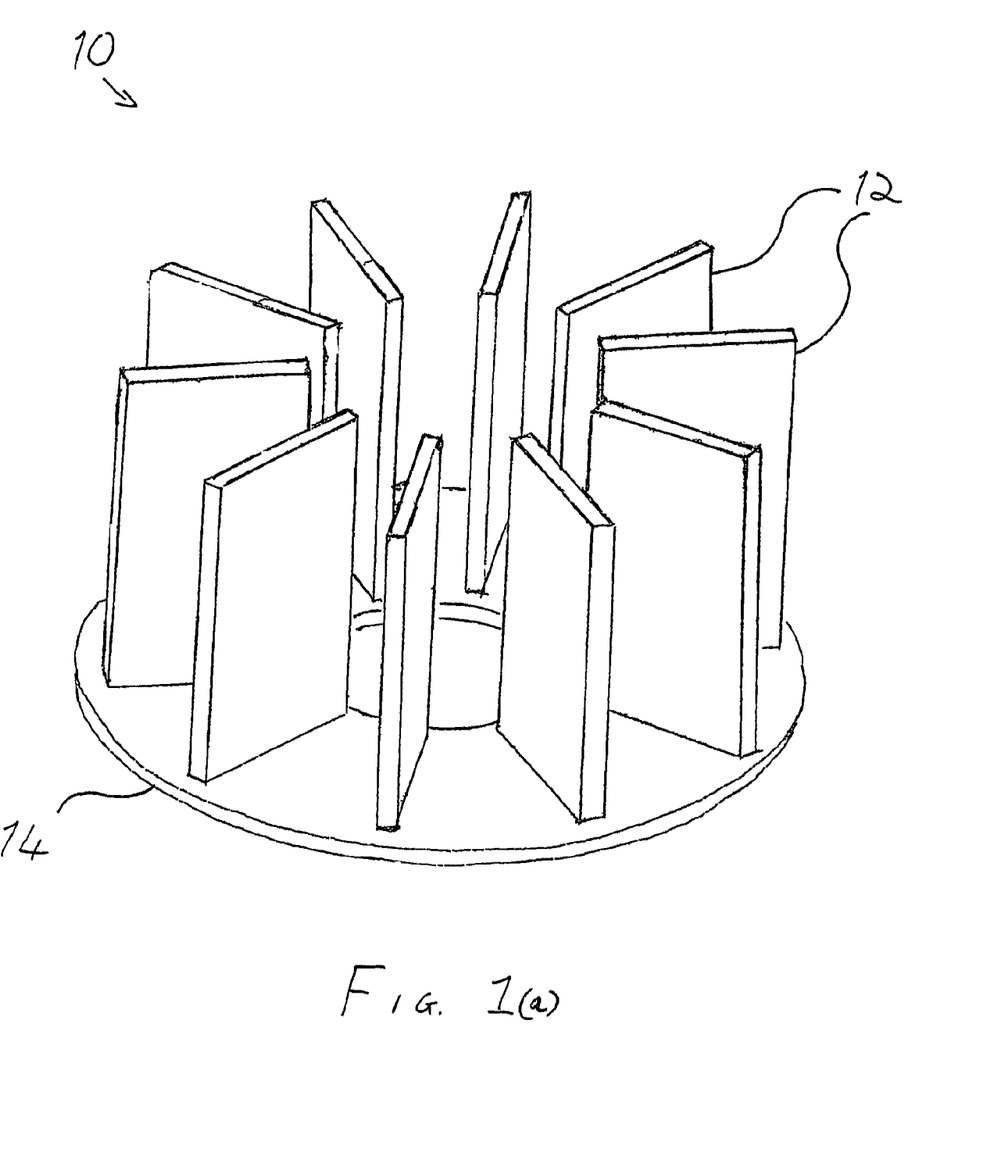
FIG. 1(a) is a perspective view of a known planar magnetic printed circuit board current sensor.
Figure 6:
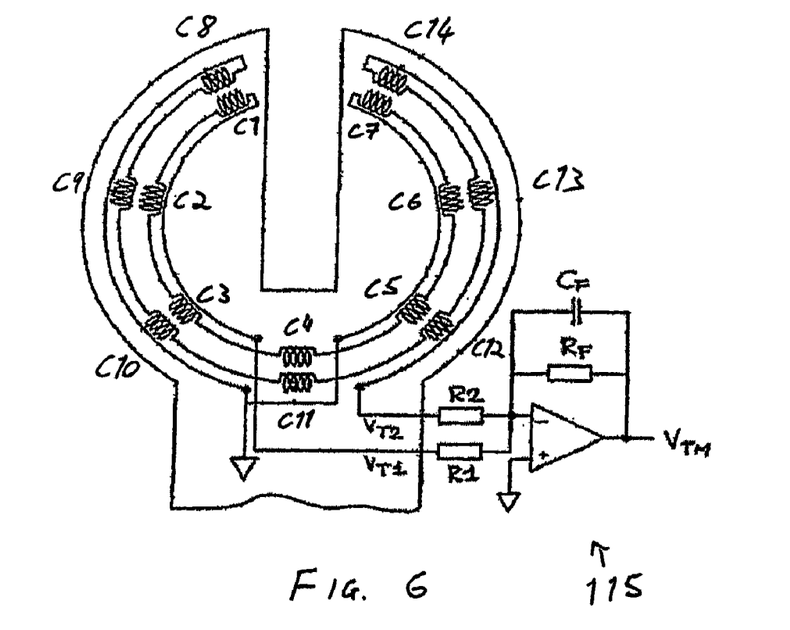
FIG. 6 is a circuit diagram of a conventional planar magnetic printed circuit board current sensor.

As shown in FIGS. 1(a) and 6, Irish Patent Application No. S2001/0370 describes a current sensor 10 comprising a number of inductive PCB sensor elements, or coil boards 12 which are vertically mounted in a symmetric fashion around a current-carrying conductor (not shown) on a motherboard 14. The coil boards 12 carry a pair of substantially identical coils C1-C14 of non-magnetic material, which are arranged in a notional loop as shown in FIG. 6. The current sensor also comprises means 115 for deriving the alternating current in the conductor as a function of the voltages induced in the series-connected coils C1-14.

In the known PMCS sensor 10, as shown in FIGS. 1a and 6, the input noise to the input amplifier 115 of the signal conditioning stage is typically in the region of 30 nV. In order for the sensor 10 to measure the 0.1 mA, the pickup voltage presented to the amplifier 115 must be at least 30 nV to give a signal to noise ratio of 1.

The sensor, however, may be used in an environment where it is subject to transient spikes of current, and this causes certain difficulties. For example, a typical sensor will be normally used to measure an alternating current in a conductor, of frequency 50 Hz, and of minimum amplitude 0.1 mA. At certain intervals, this same conductor might be subject to transient current pulses, with a rise time of 4 μS and an amplitude of greater than 100 kA, such as when lightning strikes occur.

Assuming the frequency of the 100 kA pulse current to be at 50 Hz, then the voltage pickup of the sensor 10 would be larger than 30 nV, by a factor of 100 kA divided by 0.1 mA, i.e. a factor of $10^9$ greater. This would lead to a voltage induced in the di/dt sensor 10 of 30 nV multiplied by $10^9$, equal to 30V.

However, as mentioned earlier, the amplitude of the induced voltage is not only dependent on the amplitude of the current, but also on the frequency, and the frequency of such transient currents will not normally be the mains frequency of 50/60 Hz.

So, for a current pulse with a rise time of 4 μS, the actual voltage developed in the sensor 10 would be equal to the voltage induced at 50 Hz multiplied by the ratio of the actual pulse frequency to the 50 Hz frequency, i.e.

$$V = \frac{30 \text{ nV} \times 10^9 \times f_p}{50}$$

where fp is the equivalent frequency of the pulse.

The equivalent frequency of a pulse of rise time $t_r$ is given as $$f_p = \frac{1}{2\pi t_r}$$

Therefore, the voltage induced in the sensor 10 by a pulse of rise time 4 μS (equivalent frequency of about 40 kHz) and an amplitude of 100 kA is as follows:

$$V = \frac{30 \text{ nV} \times 10^9}{2\pi \times 4 \text{ μS} \times 50} = \frac{30 \times 10^{-9} \times 10^9}{2 \times 3 \times 4 \times 10^{-6} \times 50}.$$

which gives a value of approx 25,000V if the value of π is approximated to 3.

This is a very large value of voltage for a practical current sensor to be able to handle. Any voltage tracks across which this value of voltage will appear will need to be spaced sufficiently to avoid flashover. For a voltage level of 25,000 volts such spacing would be in the some tens of centimeters. This would not only lead to increasing the size of the sensor to an impractically large size, but the large spacing between the tracks leading from the pickup coils would cause the sensor to be more susceptible to external interference, as described in the aforementioned patent.

As well as this, all components across which this voltage appears, (e.g. resistors, op-amps) would have to be sufficiently rated such as to be able to endure this voltage level without deterioration of performance or damage to the component.

It can be quickly deduced from the above that to manufacture such a sensor on a commercial basis is prohibitively expensive and impractical.

This invention describes improvements to current sensors which aim to minimise these limitations, thereby enabling a di/dt based current sensor to be manufactured at a reasonable cost, and which can operate satisfactorily in the environment described.

SUMMARY OF THE INVENTION

Accordingly, there is provided a sensor for measuring alternating current in a conductor, said sensor comprising:
 a generally cylindrical inner conductive shield for mounting around a conductor,
 a generally cylindrical outer conductive shield enclosing the inner conductive shield, said outer and inner conductive shields defining therebetween a generally annular cylindrical space, and
 a sensor arrangement mounted in said annular space,
 said sensor arrangement having a connection for measuring circuitry such that the alternating current in the conductor can be calculated as a function of a signal induced in the sensor arrangement,
 said inner and outer conductive shields being effective to attenuate the magnetic fields associated with transient pulses of a frequency above the frequencies to be measured, as a result of eddy currents formed in the inner and outer conductive shields.

The use of the conductive shields allows for the prevention of high transient voltages and eddy currents that may damage the sensor itself.

Preferably, the depth of the inner and outer conductive shields is chosen to produce eddy currents sufficient enough to attenuate the magnetic fields associated with transient pulses of a frequency above the frequencies to be measured.

Preferably, the material of the inner and outer conductive shields is chosen from one of the following: silver, copper, gold, aluminium, brass, or one of their alloys.

Preferably, the generally annular space defined between the inner and outer conductive shields is conductively sealed.

Preferably, one or both of the inner and outer conductive shields tapers towards the other of said shields to conductively seal about the generally annular space defined therebetween.

Preferably, a pair of sealing caps are positioned at either end of the inner and outer conductive shields to conductively seal the generally annular space defined between the inner and outer conductive shields.

Preferably, an aperture is provided from the exterior of the conductive shields or sealing caps, if present, to the annular space, to allow an output signal to pass from the interior of the sensor to the exterior of the sensor for monitoring.

Preferably, the annular sensor arrangement comprises a plurality of inductive sensor elements, the sensor elements being arranged symmetrically about the annular space.

Preferably, the annular sensor arrangement further comprises a motherboard located within the annular space, the sensor elements being vertically mounted on the motherboard.

Preferably, one or more of the sensor elements comprises a pair of substantially identical coils: an inner coil located adjacent the inner conductive shield and an outer coil located adjacent the outer conductive shield.

Preferably, the coils are non-magnetic.

Preferably, the inner coils are electrically coupled in series along a path defining an inner notional loop, and the outer coils are electrically coupled in series along a path defining an outer notional loop.

Preferably, the measuring circuitry is operable to calculate the alternating current in the conductor as a function of the voltages induced in the inner notional loop and the outer notional loop.

Preferably, the measuring circuitry is located within the generally annular cylindrical space.

Alternatively, and subject to electrical noise considerations, some of the components of the measuring circuitry may be located remotely outside the annular cylindrical space.

Preferably, the measuring circuitry comprises an amplifier circuit.

Preferably, a first subset of said sensor elements are mounted on a first support member, a second subset of said sensor elements are mounted on a second support member, and said first and second support members are arranged relative to one another so that each subset of sensor elements projects towards the support member on which the other subset is mounted, and the first subset of sensor elements being interleaved with the second subset of sensor elements.

Preferably, said annular sensor arrangement comprising a plurality of coils and a resistance connected in series along a path defining a notional loop, and an amplifier having an input connected to one end of said path, the other end of the path being connected to a reference, characterised in that said resistance comprises a plurality of discrete resistors distributed along said path among the coils.

In a second independent aspect of the invention, there is provided a sensor for measuring alternating current in a conductor, said sensor comprising a set of sensor elements arranged along a path defining a notional loop, said sensor being configured to allow a conductor to be introduced into the interior of the notional loop,
a first subset of said sensor elements being mounted on a first support member,
a second subset of said sensor elements being mounted on a second support member, and
said first and second support members being arranged relative to one another so that each subset of sensor elements projects towards the support member on which the other subset is mounted, and the first subset of sensor elements being interleaved with the second subset of sensor elements.

Due to the minimum space requirements for the pads that connect to the sensor elements, the interleaving of the sensor elements allows for a greater number of sensor elements to be mounted within a given circuit board area. The greater the number of sensor elements, the larger the signal measured, and the greater the rejection of outside interference.

Preferably, the sensor elements each comprise a pair of substantially identical coils: an inner coil located on that side of the sensor element adjacent the interior of the notional loop and an outer coil located on that side of the sensor element away from the interior of the notional loop.

Preferably, the coils are non-magnetic.

Preferably, the inner coils are electrically coupled in series along a first path defining an inner notional loop, and the outer coils are electrically coupled in series along a second path defining an outer notional loop.

Preferably, said first and second paths defining notional loops are circular paths.

Preferably, the inner coils of the sensor elements of the first subset are electrically coupled in series on the first support member to provide a first inner coil series, the inner coils of the sensor elements of the second subset are electrically coupled in series on the second support member to provide a second inner coil series, and the first and second inner coil series are electrically coupled in series with one another.

Preferably, the outer coils of the sensor elements of the first subset are electrically coupled in series on the first support member to provide a first outer coil series, the outer coils of the sensor elements of the second subset are electrically coupled in series on the second support member to provide a second outer coil series, and the first and second outer coil series are electrically coupled with one another.

Preferably, the inner coils are substantially equally spaced about said inner notional loop, and the outer coils are substantially equally spaced about said outer notional loop.

Preferably, the alternating current in the conductor is derived as a function of the voltage induced in the inner coils and the voltage induced in the outer coils.

Preferably, the first subset of sensor elements are arranged to couple to the second support member, and the second subset of sensor elements are arranged to couple to the first support member, when the first subset and the second subset of sensor elements are arranged to interleave with each other.

Preferably, the first and second support members each comprise a circuit board having a physical connection for mounting the sensor elements and having electrical circuitry for connecting the sensor elements to one another.

Preferably, the sensor elements each comprise a circuit board for mounting on said physical connections of the support members, whereby the sensor element circuit boards project perpendicularly from the support member circuit boards.

Preferably, the first and second support member circuit boards are each annular boards having a central hole for receiving said conductor.

Preferably, the sensor element circuit boards are generally planar and are mounted with their planes aligned substantially radially from the central hole to an outer perimeter of the annular support member circuit boards.

In a third independent aspect of the invention, there is provided a sensor circuit for measuring alternating current in a conductor, said sensor circuit comprising a plurality of discrete sensors and a resistance connected in series along a path defining a notional loop, and an amplifier having an input connected to one end of said path, the other end of the path being connected to a reference, characterised in that said resistance comprises a plurality of discrete resistors distributed along said path among the sensors.

With the resistance distributed throughout the coil, the voltage in the sensor is distributed across each resistance. As a consequence, the voltage seen at the entrance to the amplifier is not as high, resulting in improved tracking.

Preferably, each sensor has a discrete resistor associated with it, said discrete resistor directly connected in series with the sensor.

As the resistances are distributed around the circuit, and not localised at the input to the amplifier, this means that the voltage present in the tracks is prevented from producing sparking across the gaps in the circuit.

Thus, the resistances (R) and sensors (S) could be connected in series with each resistor directly connected to a sensor, such as -(S-R)-(S-R)-(R-S)-(S-R)-(R-S)-, with the parentheses showing simply that each sensor has a resistance associated with it. It is envisaged also that more than one resistance per sensor can be distributed in series along this path.

Preferably, the discrete resistances alternate with the sensors along a circuit path.

Thus, the preferred arrangement, using the notation described earlier, is -S-R-S-R-S-R-S-R-.

Preferably, the discrete sensors each comprise an inductive sensor.

Preferably, the discrete sensors each comprise a coil.

Preferably, the sensor circuit is configured to allow said conductor to be introduced into the interior of the notional loop.

Preferably, the sensors are grouped as a first subset of inner sensors, and a second subset of outer sensors, the first subset of inner sensors are arranged in series along a path defining an inner notional loop, the second subset of outer sensors are arranged in series along a path defining an outer notional loop, and the discrete resistors are arranged in series with said sensors about said inner and outer notional loops.

Preferably, the alternating current in the conductor is derived as a function of the voltages induced in the inner and outer notional loops.

It will be understood that the three different independent aspects of the invention discussed herein, and claimed in independent claims 1 and 18, namely that of the inner and outer conductive shields, the mounting of sensor elements on separate motherboards, and the discrete resistances distributed about the notional loop, are interchangeable, and any two, or all, may be employed within the same sensor. It will also be understood that any features in the claims dependent on one independent claim may be reproduced as being dependent on the other independent claims also.

BRIEF DESCRIPTION OF DRAWINGS

The invention will now be further illustrated by the following description of embodiments thereof, given by way of example only and with reference to the accompanying drawings.

DETAILED DESCRIPTION OF PREFERRED EMBODIMENTS

Figure 1B:
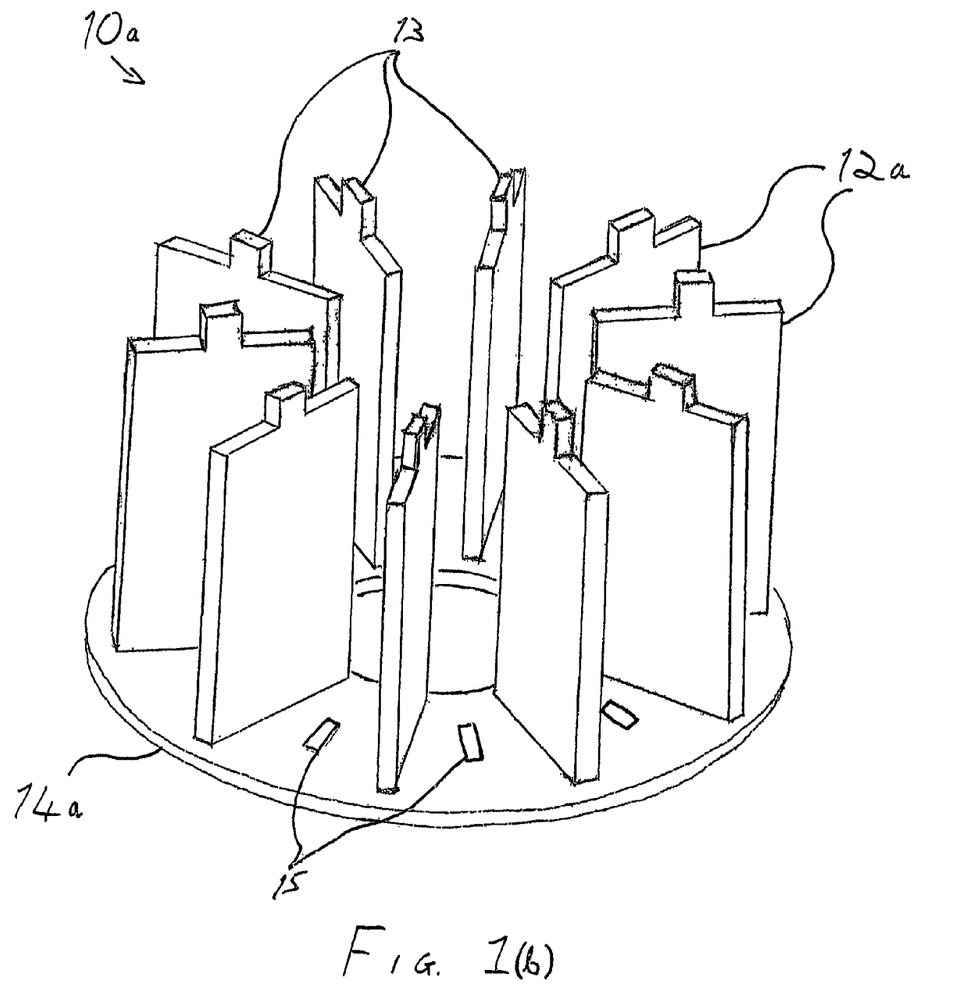
FIG. 1(b) is a perspective view of an improved planar magnetic printed circuit board current sensor.
Figure 7:
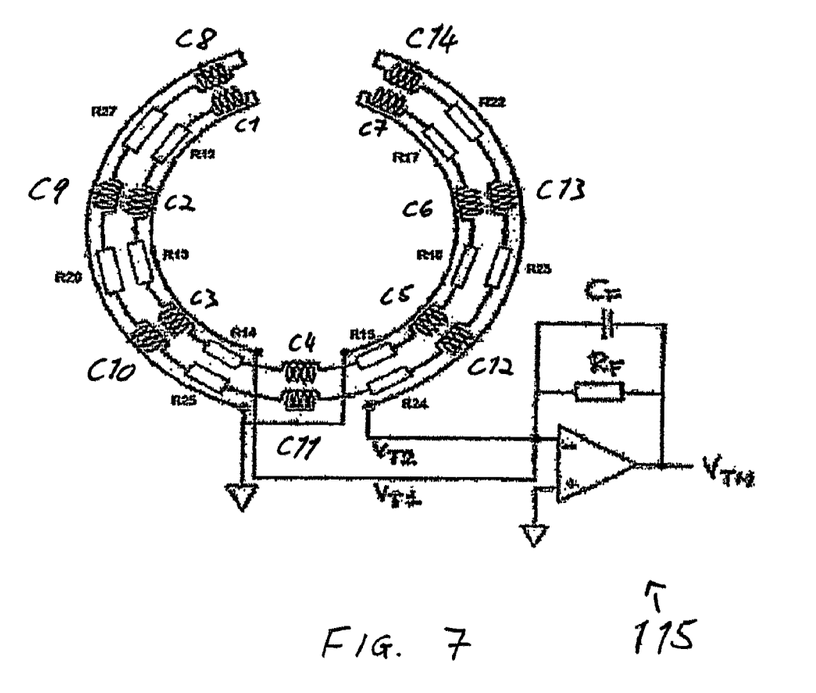
FIG. 7 is a circuit diagram of a planar magnetic circuit board current sensor according to a third embodiment of the invention.

With reference to FIG. 1(b), an improved current sensor 10a is shown. The sensor 10a comprises a number of inductive PCB sensor elements (or coil boards) 12a which are vertically mounted in a symmetric fashion around a current-carrying conductor (not shown) on a motherboard 14a. As above, the sensor elements 12a comprise a pair of substantially identical coils C1-C14 of non-magnetic material, which are arranged in a notional loop as shown in FIG. 7. A plurality of apertures 15 are located on the motherboard 14a. A single aperture 15 is located between two successive sensor elements 12a, equidistant between the two sensor elements 12a.

In order to eliminate the inducement of the high voltages mentioned above appearing in the sensor, a shielding material is introduced between the sensor and the conductor, which lets through the 50 Hz signal to be measured, but blocks the effect of the high current pulse.

Figure 2:
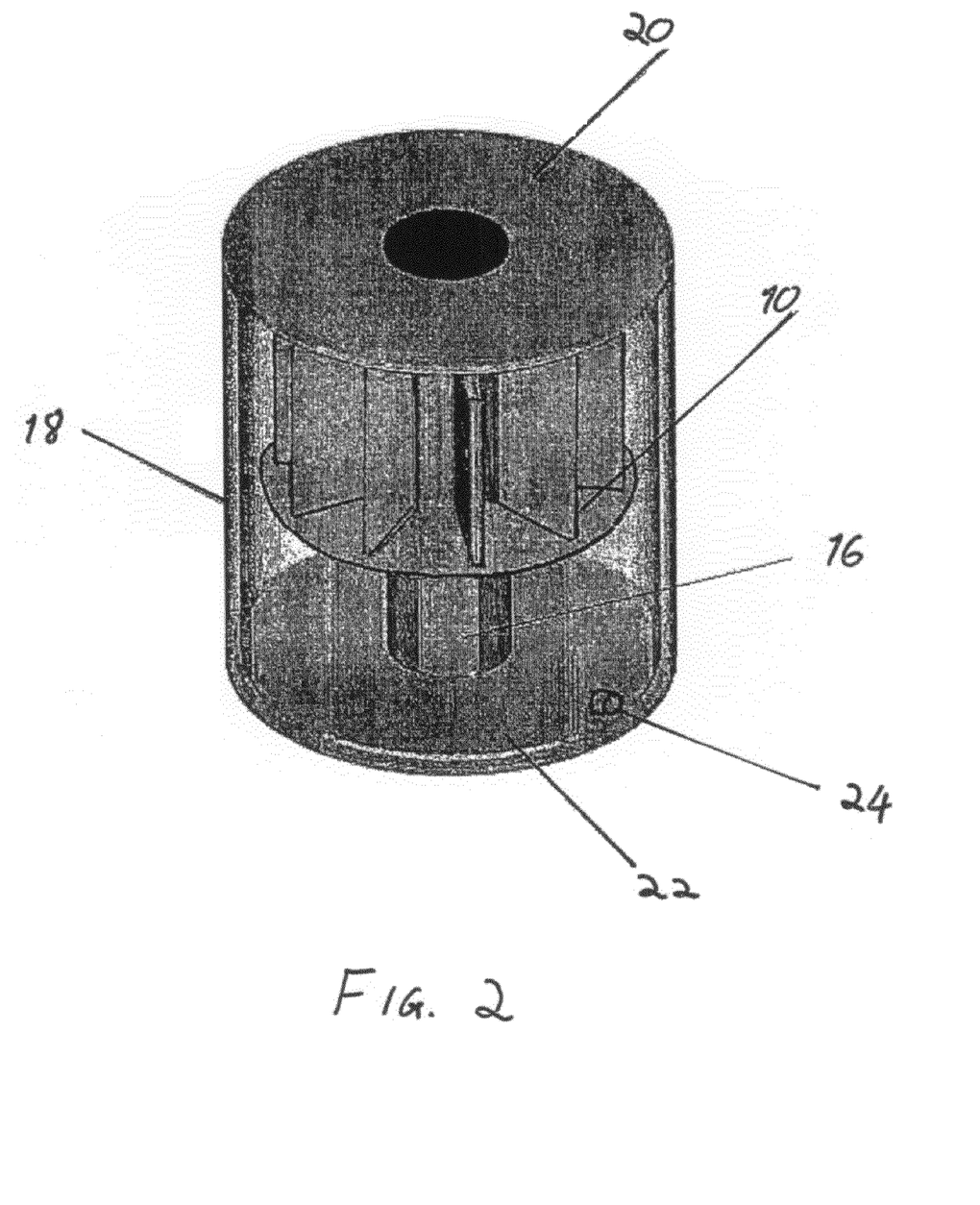
FIG. 2 is a perspective view of a planar magnetic circuit board current sensor according to a first embodiment of the invention.
Figure 3:
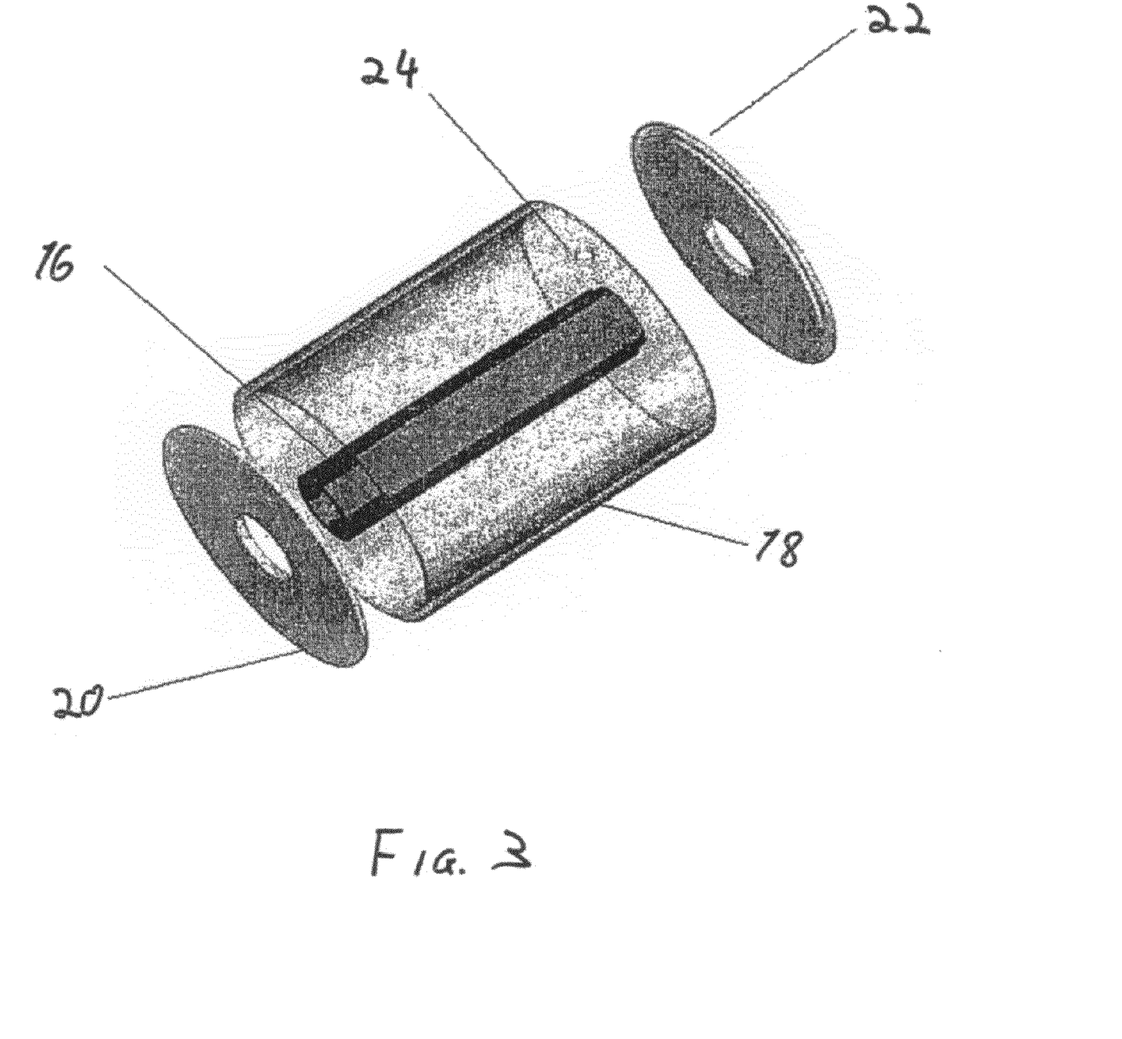
FIG. 3 is an exploded perspective view of the conductive shields of the embodiment of FIG. 2.

With reference to FIGS. 2 and 3, this is accomplished by surrounding the sensor 10a by a conductive shield constructed from a highly conductive material (such as brass or aluminium).

The shield consists of two concentric cylinders 16, 18 constructed from a conductive material. For conductors such as brass or aluminium, the optimum thickness would be of the order of 2.5 mm.

The inner cylinder 16 has an inner diameter of slightly larger than the diameter of the conductor being measured. The (insulated) conductor passes through this inner cylinder.

The sensor 10a is positioned around the outside of the inner cylinder 16. The outer cylinder 18 is positioned around the outer rim of the sensor 10a. Top and bottom caps 20, 22 are conductively sealed to the top and bottom of the cylinder, as shown in FIG. 3, such that the sensor 10a is effectively completely enclosed in the cylinder, save for the conditioned output signal from the measurement circuit comprising the sensor 10a and the amplifier means 115, which passes through a small hole 24 in the wall of the outer cylinder 18.

A gap is created between the sensor 10a and the top and bottom caps 20, 22. The gap is generally of the order of 1 cm.

The shield operates on the basis that when a conductive material is positioned in a magnetic field, eddy currents are induced in the skin of the material. In the situation where the magnetic field is generated by a current flowing in a conductor, these eddy currents are such that they will oppose the fields causing them, reducing the overall magnetic field in the inner compartment formed by the conducting cylinders. The depth to which these eddy currents occur (skin depth) is indirectly proportional to the square root of the frequency of the current causing the original magnetic field.

The formula for the attenuation factor F for a given material thickness of copper or aluminium is as follows:

$$F = \frac{2 \cdot e^{-\frac{D}{\delta}}}{\sqrt{1 + 2 \cdot \cos\frac{D}{\delta} \cdot e^{-\frac{D}{\delta}} + (e^{-\frac{D}{\delta}})^2}}$$

which at higher frequencies approximates to $$F = 2 \cdot e^{-\frac{D}{\delta}}$$

where D is the thickness of the conductive material, and δ is the skin-depth of the conductive material and is equal to $$\delta = \sqrt{\frac{1}{\pi \cdot f \cdot \mu \cdot \sigma}}$$

and therefore inversely proportional to frequency, and which in turn leads to the attenuation factor F increasing as frequency increases. In the above formula, μ is the magnetic permeability of the material, and σ is the electrical conductivity of the material.

For conductors such as copper or aluminium, the optimum thickness in order to sufficiently attenuate the frequencies associated with a pulse of rise-time 4 μS would be of the order of 2.5 mm.

So, for a current at frequency of 50 Hz, the skin depth is greater than 2.5 mm, while for the equivalent frequency (40 kHz) of a transient current pulse of rise-time 4 μS, the skin depth is much less than 2.5 mm.

As a result, a shield as described above, constructed from a material of 2.5 mm highly conductive material, will allow through magnetic fields associated with 50 Hz currents, while considerably attenuating the magnetic field associated with the high current pulse.

The attenuation factor for the field associated with the high current pulse is approximately 100. Therefore, for the example described above, when without such a shield the voltage induced in the sensor circuitry for a current pulse of amplitude 100 kA and rise-time 4 μS would be 25,000V, with the sensor 10a placed within such a shield, the voltage induced would be in the region of 250V.

Although considerably less that 25,000V, the voltage of 250 volts still presents some problems in relation to component voltage rating, and PCB track spacing.

To further reduce these problems, a further aspect of the invention is to use distributed resistances at specific locations in the circuit to effectively divide the voltage evenly across the circuit. This is described in detail later in this document. Firstly, the construction of the PMCS sensor 10a is described, and with it yet another aspect of this invention is introduced, outlining further improvements to the original sensor which improve the operation of the sensor in this particular environment.

With reference to FIGS. 1 and 6, the conventional PMCS sensor 10 consists of two circles of concentric coils C1-14 evenly spaced around the current carrying conductor being measured, as described in more detail in Irish Patent Application No. S2005/00329 referred to above. The inner set of coils C1-7 pick up a voltage which is predominantly proportional to the magnetic field associated with the current being measured. The outer set of coils C8-14 pick up a voltage which is predominantly proportional to the magnetic field(s) associated with any current carrying conductor external and in the vicinity of the sensor 10. The conditioning circuitry 115 subtracts the two signals to give a signal representing the current in the conductor being measured.

In one application envisaged for this sensor, the requirement is to measure an extremely low value of AC current, i.e. in the region of 0.1 mA. In order to increase the pickup of the magnetic field associated with this low current, the number of coils on the inner circle C1-7 of the sensor 10a must be as high as possible. Also because the picked up signal is low, it is extremely susceptible to noise. Therefore, the number of coils in the outer circle C8-14 must also be increased to reduce the effect of interference caused from noise and external interfering magnetic fields. There is, however, a practical limit to the number of sensor elements (or coil boards) 12a which can be placed on the motherboard 14a because of the physical size of the coil boards 12a, and also because of the minimum area required on the motherboard 14a for tracking and pads between coils C1-14.

A further aspect of this invention therefore, is the implementation of a method of increasing the number of coils without significantly increasing the volume size of the sensor.

Figure 4:
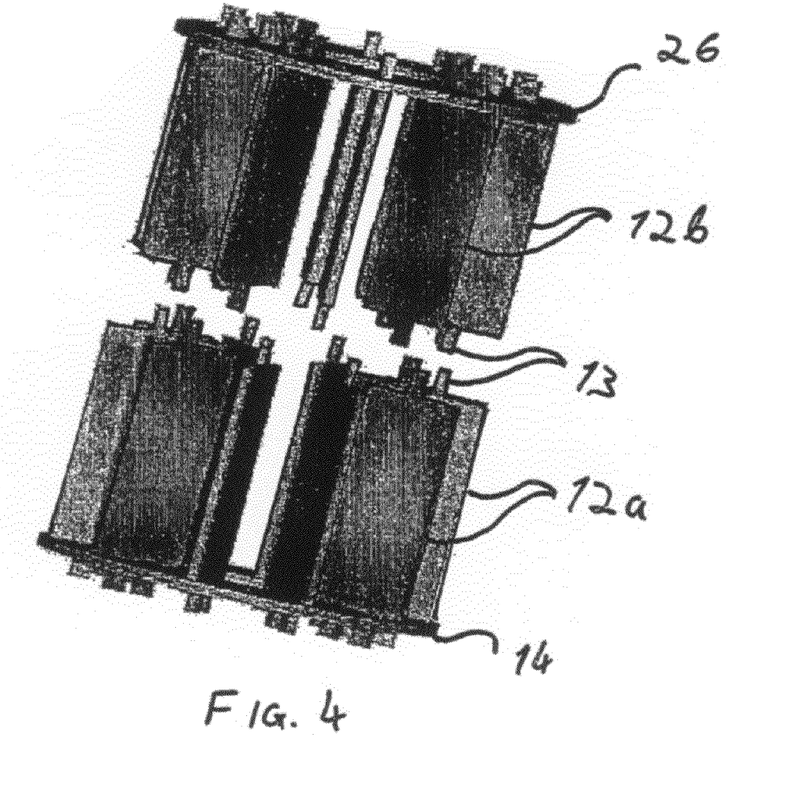
FIG. 4 is a perspective view of a planar magnetic circuit board current sensor prior to assembly, according to a second embodiment of the invention.
Figure 5:
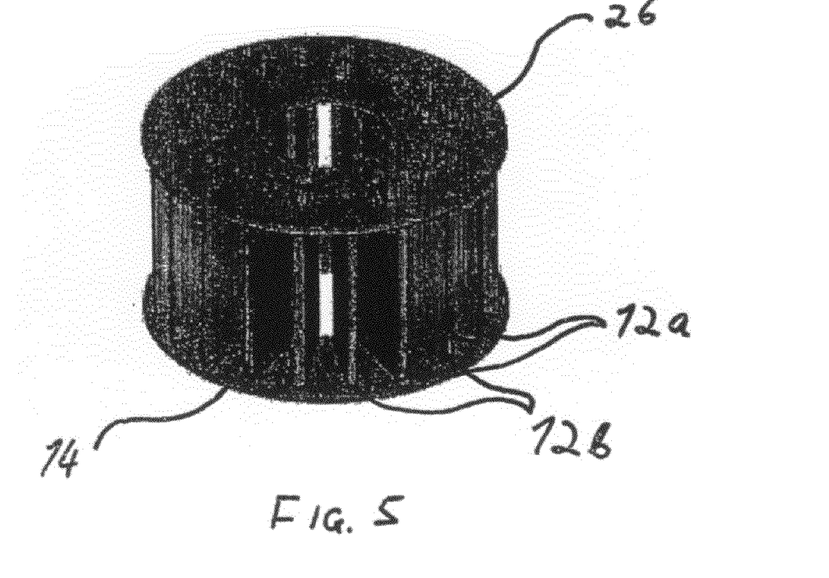
FIG. 5 is a perspective view of the embodiment of FIG. 4 after assembly.

With reference to FIGS. 4 and 5, this is achieved by having a second motherboard 26 similar to the first motherboard 14a, and with the same number of coil boards 12b, mounted upside down on top of the first mother board 14a, as shown in FIG. 4 and FIG. 5, such that the coil boards 12b on the second motherboard 26 end up positioned between the coil boards 12a on the first motherboard 14a.

As can be seen in FIG. 4, engagement members 13 are located on the free ends of the coil boards 12a,12b. These engagement members 13 couple with corresponding apertures 15 in the opposite motherboards, i.e. the coil boards 12a mounted on the first motherboard 14a engage with the second motherboard 26, while the coil boards 12b mounted on the second motherboard 26 engage with the first motherboard 14a. This provides for a secure construction of the improved sensor.

Each coil board 12a on the first motherboard 14a is positioned equidistant between two coil board 12b on the second motherboard 26, as shown in FIG. 5. The coils in both motherboards 14a, 26 are connected as if all coils were mounted on a single motherboard. Because the coils in the inner circle need only be connected in series with one another (and the same applies to the coils in the outer circle), the order of coils is irrelevant. So in practice the electrical connection between coils on the inner circle will follow in series along the first motherboard and from there will connect to the coils along the second motherboard inner circle. The order of electrical connection will therefore not follow the physical order of coils around the interleaved circle because each coil is separated from its electrical neighbour by an interleaved coil from the other motherboard.

The effect of the second board of coils is to double the number of coils, and thereby double the pickup of the signal from the inner set of coils. Furthermore, the increase in the number of coils in the outer circle has a more significant influence on the rejection of external interference, as this increases exponentially as the number of coils increases.

Returning to the issue of further reduction of the voltage induced in the sensor by use of a distributed resistance, this is achieved by the splitting of the resistor components R1, R2 at the output of the coils into separate smaller resistances R12-17, R22-27, positioned at each coil position on the motherboards.

In the existing version of the PMCS sensor, the reduced voltage of 250V mentioned above would appear across the resistor values R1 and R2, as shown in FIG. 6 above. By splitting this value into separate resistors, R12 to R17 and R22 to R27, effectively connected in series, as shown in FIG. 7 the voltage across each resistor is now divided by the number of coils in the unit. In this way the voltage rating of the resistor components R12-17, R22-27 can be brought back to a low level. More importantly though, the lower the voltage at the output of the coils, the closer the PCB tracking can be. This in turn improves the susceptibility of the circuit to external interference, as described in the above-mentioned patent.

An application for the improved current sensor device described in this invention is in the monitoring of surge arrestor devices used on electricity transmission and distribution lines. Surge arrestor devices are used to provide a low impedance path to earth for currents induced by lightning strikes, while otherwise presenting a high impedance to the network. The lifetime of the surge arrestor is reduced each time it is subject to a lightning strike. The increase in leakage current through the device in high impedance mode gives an indication of the condition of the arrestor, and therefore, when it needs to be replaced.

The invention is not limited to the embodiments described herein, and may be changed without departing from the scope of the invention.

The invention claimed is:

1. A sensor for measuring alternating current in a conductor, said sensor comprising:
    a generally cylindrical inner conductive shield for mounting around a conductor,
    a generally cylindrical outer conductive shield enclosing the inner conductive shield, said outer and inner conductive shields defining therebetween a generally annular cylindrical space, and
    a sensor arrangement mounted in said annular space,
    said sensor arrangement having a connection for measuring circuitry such that the alternating current in the conductor can be calculated as a function of a signal induced in the sensor arrangement,
    said inner and outer conductive shields being effective to attenuate the magnetic fields associated with transient pulses of a frequency above the frequencies to be measured, as a result of eddy currents formed in the inner and outer conductive shields.

2. A sensor as claimed in claim 1, wherein the depth of the inner and outer conductive shields is chosen to produce eddy currents sufficient enough to attenuate the magnetic fields associated with transient pulses of a frequency above the frequencies to be measured.

3. A sensor as claimed in claim 1, wherein the material of the inner and outer conductive shields is chosen from one of the following: silver, copper, gold, aluminum, brass, or one of their alloys.

4. A sensor as claimed in claim 1, wherein the generally annular space defined between the inner and outer conductive shields is conductively sealed.

5. A sensor as claimed in claim 4, wherein one or both of the inner and outer conductive shields tapers towards the other of said shields to conductively seal about the generally annular space defined therebetween.

6. A sensor as claimed in claim 4, wherein a pair of sealing caps are positioned at either end of the inner and outer conductive shields to conductively seal the generally annular space defined between the inner and outer conductive shields.

7. A sensor as claimed in claim 1, wherein an aperture is provided from the exterior of the conductive shields or sealing caps, if present, to the annular space, to allow an output signal to pass from the interior of the sensor to the exterior of the sensor for monitoring.

8. A sensor as claimed in claim 1, wherein the annular sensor arrangement comprises a plurality of inductive sensor elements, the sensor elements being arranged symmetrically about the annular space.

9. A sensor as claimed in claim 8, wherein the annular sensor arrangement further comprises a motherboard located within the annular space, the sensor elements being vertically mounted on the motherboard.

10. A sensor as claimed in claim 8, wherein one or more of the sensor elements comprises a pair of substantially identical coils: an inner coil located adjacent the inner conductive shield and an outer coil located adjacent the outer conductive shield.

11. A sensor as claimed in claim 10, wherein the coils are non-magnetic.

12. A sensor as claimed in claim 10, wherein the inner coils are electrically coupled in series along a path defining an inner notional loop, and the outer coils are electrically coupled in series along a path defining an outer notional loop.

13. A sensor as claimed in claim 10, wherein the measuring circuitry is operable to calculate the alternating current in the conductor as a function of the voltages induced in the inner notional loop and the outer notional loop.

14. A sensor as claimed in claim 1, wherein the measuring circuitry is located within the generally annular cylindrical space.

15. A sensor as claimed in claim 1, wherein the measuring circuitry comprises an amplifier circuit.

16. A sensor as claimed in claim 8, wherein
    a first subset of said sensor elements are mounted on a first support member,
    a second subset of said sensor elements are mounted on a second support member, and
    said first and second support members are arranged relative to one another so that each subset of sensor elements projects towards the support member on which the other subset is mounted, and the first subset of sensor elements being interleaved with the second subset of sensor elements.

17. A sensor as claimed claim 1, said sensor arrangement comprising a plurality of coils and a resistance connected in series along a path defining a notional loop, and an amplifier having an input connected to one end of said path, the other end of the path being connected to a reference, characterised in that said resistance comprises a plurality of discrete resistors distributed along said path among the coils.

18. A sensor for measuring alternating current in a conductor, said sensor comprising a set of sensor elements arranged along a path defining a notional loop, said sensor being configured to allow a conductor to be introduced into the interior of the notional loop,
    a first subset of said sensor elements being mounted on a first support member,
    a second subset of said sensor elements being mounted on a second support member, and
    said first and second support members being arranged relative to one another so that each subset of sensor elements projects towards the support member on which the other subset is mounted, and the first subset of sensor elements being interleaved with the second subset of sensor elements;

wherein the sensor elements each comprise a pair of substantially identical coils: an inner coil located on that side of the sensor element adjacent the interior of the notional loop and an outer coil located on that side of the sensor element away from the interior of the notional loop.

19. A sensor as claimed in claim 18, wherein the coils are non-magnetic.

20. A sensor as claimed in claim 18, wherein the inner coils are electrically coupled in series along a first path defining an inner notional loop, and the outer coils are electrically coupled in series along a second path defining an outer notional loop.

21. A sensor as claimed in claim 20, wherein said first and second paths defining notional loops are circular paths.

22. A sensor as claimed in claim 20, wherein
the inner coils of the sensor elements of the first subset are electrically coupled in series on the first support member to provide a first inner coil series,
the inner coils of the sensor elements of the second subset are electrically coupled in series on the second support member to provide a second inner coil series, and
the first and second inner coil series are electrically coupled in series with one another.

23. A sensor as claimed claim 20, wherein
the outer coils of the sensor elements of the first subset are electrically coupled in series on the first support member to provide a first outer coil series,
the outer coils of the sensor elements of the second subset are electrically coupled in series on the second support member to provide a second outer coil series, and
the first and second outer coil series are electrically coupled with one another.

24. A sensor as claimed in claim 20, wherein the inner coils are substantially equally spaced about said inner notional loop, and the outer coils are substantially equally spaced about said outer notional loop.

25. A sensor as claimed in claim 18, wherein the alternating current in the conductor is derived as a function of the voltage induced in the inner coils and the voltage induced in the outer coils.

26. A sensor as claimed in claim 18, wherein
the first subset of sensor elements are arranged to couple to the second support member, and
the second subset of sensor elements are arranged to couple to the first support member, when the first subset and the second subset of sensor elements are arranged to interleave with each other.

27. A sensor as claimed in claim 26, wherein the first and second support members each comprise a circuit board having a physical connection for mounting the sensor elements and having electrical circuitry for connecting the sensor elements to one another.

28. A sensor as claimed in claim 27, wherein the sensor elements each comprise a circuit board for mounting on said physical connections of the support members, whereby the sensor element circuit boards project perpendicularly from the support member circuit boards.

29. A sensor as claimed in claim 28, wherein the first and second support member circuit boards are each annular boards having a central hole for receiving said conductor.

30. A sensor as claimed in claim 29, wherein the sensor element circuit boards are generally planar and are mounted with their planes aligned substantially radially from the central hole to an outer perimeter of the annular support member circuit boards.

* * * * *